United States Patent
I et al.

(10) Patent No.: US 12,542,563 B2
(45) Date of Patent: Feb. 3, 2026

(54) LINEARIZATION OF DELAY DOMAIN ANALOG-TO-DIGITAL CONVERTERS

(71) Applicant: Texas Instruments Incorporated, Dallas, TX (US)

(72) Inventors: Mishab I, Manjeri (IN); Viswanathan Nagarajan, Bangalore (IN); Himanshu Varshney, Bangalore (IN); Mujammil Patel, Mumbai (IN); Karan Vaity, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 33 days.

(21) Appl. No.: 18/619,537

(22) Filed: Mar. 28, 2024

(65) Prior Publication Data

US 2025/0309913 A1  Oct. 2, 2025

(51) Int. Cl.
*H03M 1/46* (2006.01)
*H03M 1/06* (2006.01)
*H03M 1/10* (2006.01)
*H03M 1/36* (2006.01)

(52) U.S. Cl.
CPC ............ *H03M 1/464* (2013.01); *H03M 1/06* (2013.01); *H03M 1/1009* (2013.01); *H03M 1/1014* (2013.01); *H03M 1/36* (2013.01)

(58) Field of Classification Search
CPC ...... H03M 1/464; H03M 1/06; H03M 1/1014; H03M 1/1009; H03M 1/36
See application file for complete search history.

(56) References Cited

U.S. PATENT DOCUMENTS

| | | |
|---|---|---|
| 9,154,146 B1 | 10/2015 | Chiu et al. |
| 10,284,188 B1 | 5/2019 | Soundararajan et al. |
| 10,673,453 B1 | 6/2020 | Pentakota et al. |
| 10,778,243 B2 | 9/2020 | Pentakota et al. |
| 11,309,903 B1 | 4/2022 | Miglani et al. |
| 11,316,525 B1 | 4/2022 | Pentakota et al. |
| 11,316,526 B1 | 4/2022 | Rajagopal et al. |
| 11,387,840 B1 | 7/2022 | Miglani et al. |

(Continued)

OTHER PUBLICATIONS

U.S. Appl. No. 18/174,187, filed Feb. 24, 2023.

(Continued)

*Primary Examiner* — Joseph J Lauture
(74) *Attorney, Agent, or Firm* — Mandy Barsilai Fernandez; Frank D. Cimino

(57) ABSTRACT

A delay-domain analog-to-digital converter (ADC) including first and second ADCs and corresponding look-up table (LUT) memories. Control logic controls the first ADC to convert a first analog level plus a first offset to a first digital value; controls the second ADC to convert the first analog level plus a second offset to a second digital value; and computes a first difference value between the first and second digital values. The control logic further controls the first ADC to convert the first analog level minus the first offset to a third digital value; controls the second ADC to convert the first analog level plus the second offset to a fourth digital value; computes a second difference value between the third and fourth digital values; and adjusts a correction value for the first analog level in the LUT memory based on a third difference between the first and second difference values.

22 Claims, 12 Drawing Sheets

(56) References Cited

U.S. PATENT DOCUMENTS

| | | |
|---|---|---|
| 11,438,001 B2 | 9/2022 | Rajagopal et al. |
| 2012/0075132 A1* | 3/2012 | Lai .................. H03M 3/38 |
| | | 341/143 |
| 2022/0224349 A1 | 7/2022 | Varshney et al. |
| 2022/0247420 A1 | 8/2022 | Rajagopal et al. |
| 2022/0247421 A1 | 8/2022 | Pentakota et al. |
| 2022/0271764 A1 | 8/2022 | Prasanth et al. |
| 2024/0072820 A1 | 2/2024 | Nurani et al. |

OTHER PUBLICATIONS

U.S. Appl. No. 18/498,358, filed Oct. 31, 2023.

Yagi et al., "Background calibration algorithm for pipelined ADC with open-loop residue amplifier using split ADC structure," 2010 IEEE Asia Pacific Conference on Circuits and Systems (IEEE, 2010), pp. 200-203.

Zhou et al., "All-Digital Background Calibration of a Pipelined-SAR ADC Using the "Split ADC" Architecture," 2023 IEEE International Symposium on Circuits and Systems (ISCAS) (IEEE, 2023), pp. 1-5.

Mcneill et al., "Digital Background-Calibration Algorithm for "Split ADC" Architecture," Trans. Circ. Sys. I: Regular Papers, vol. 56, No. 2, (IEEE, 2009), pp. 294-306.

Pena-Ramos et al., "Split-Delta Background Calibration for SAR ADCs," Trans. Circ. and Sys.II: Express Briefs, vol. 64, No. 2 (IEEE2017), pp. 221-225.

Mcneill et al., ""Split ADC" Calibration for All-Digital Correction of Time-Interleaved ADC Errors," Trans. Circ. Sys. II: Express Briefs, vol. 56, No. 5 (IEEE, 2009), pp. 344-348.

Mcneill et al., "All-Digital Background Calibration of a Successive Approximation ADC Using the "Split ADC" Architecture," Trans. Circ. Sys. I: Regular Papers, vol. 58, No. 10 (IEEE, 2011), pp. 2355-2365.

Mcneill et al., "A split-ADC architecture for deterministic digital background calibration of a 16b 1 MS/s ADC," Int'l Digest of Technical Papers, Solid-State Circ. Conf., vol. 1 (IEEE, 2005), pp. 276, 277, 598.

\* cited by examiner

LINEARIZATION OF DELAY DOMAIN ANALOG-TO-DIGITAL CONVERTERS

BACKGROUND

This specification relates to data conversion. More particularly, this specification relates to analog-to-digital converters (ADCs) of the delay domain type.

Advances in the technology of wired and wireless communications have enabled widespread deployment and new applications for such communications in recent years. Wireless communications in particular are now commonplace in short-range communications (e.g., "personal area networks"), in wireless premises networks (e.g., home or office "WiFi" networks), and in longer-range communications (e.g., cellular networks). The performance requirements across these and other network types range from low data rate and latency-tolerant applications to high data rate, real-time applications at gigahertz frequencies.

In these communications applications, the conversion of analog signal levels to digital data and vice versa is an important function carried out at each network node or device. The performance requirements for high data rate communications devices, particularly in mobile and battery-powered devices such as user equipment capable of "5G" cellular communications, are reflected in the performance requirements for data conversion circuitry in those devices. Some applications (especially for mobile devices) can require data converters to provide low error rate conversion at high data rates and over wide input bandwidths, yet at low power consumption levels. Power constraints on data converters are particularly stringent in multiple-in-multiple-out (MIMO) network devices, which commonly include integrated transceivers with as many as eight or sixteen transmitters and receivers (e.g., 8T8R, 16T16R).

ADCs operating in the "delay domain" have been proposed for high performance applications. An example prior art delay domain ADC includes a voltage-to-delay (V2D) converter that operates to convert an input voltage level to a delay between two pulses. A time-to-digital converter (TDC) encodes the delay interval output from the V2D converter into a digital output word. The delay domain signal at the output of the V2D converter is a non-linear function of the voltage differential between the input level and the reference level. This inherent non-linearity in the time-to-digital conversion transfer function is corrected in these ADCs, for example by use of a look-up table (LUT) memory in some architectures. An example of delay domain calibration using a LUT is described in U.S. Pat. No. 11,316,525, commonly assigned herewith and incorporated herein by reference. Other examples of calibration approaches in delay domain ADCs are described in U.S. Pat. No. 11,316,526, and pending U.S. patent application Ser. No. 18/174,187 filed Feb. 24, 2023, each commonly assigned with this application and incorporated herein by reference.

Another prior art delay domain ADC includes an auxiliary ADC for use in calibration of a delay domain ADC. The auxiliary ADC has a more linear transfer function, but operates at a lower data rate, than the delay domain ADC. In a calibration operation, a known digital input (e.g., from an on-chip DAC) is provided to both the delay domain ADC and the auxiliary ADC. Differences in the outputs of the delay domain ADC and auxiliary ADC are used to derive corrections stored in a LUT memory.

SUMMARY

In an example, a method includes converting a first analog level plus a first offset to a first digital value using a first delay domain analog-to-digital converter (ADC); converting the first analog level plus a second offset to a second digital value using a second delay domain ADC; computing a first difference value between the first digital value and the second digital value; converting the first analog level minus the first offset to a third digital value using the first delay domain ADC; converting the first analog level plus the second offset to a fourth digital value using the second delay domain ADC; computing a second difference value between the third digital value and the fourth digital value; computing a third difference between the first and second difference values; and storing, in a memory associated with the first delay domain ADC, an adjustment corresponding to the first analog level and based on the third difference.

In another example, a circuit includes first and second ADCs and corresponding look-up table (LUT) memories, and control logic including INL estimation logic. The control logic controls the first ADC to convert a first analog level plus a first offset to a first digital value; control the second ADC to convert the first analog level plus a second offset to a second digital value; and compute (404) a first difference value between the first digital value and the second digital value. The control logic further controls the first ADC to convert the first analog level minus the first offset to a third digital value; control the second ADC to convert the first analog level plus the second offset to a fourth digital value; compute a second difference value between the third digital value and the fourth digital value; compute a third difference between the first and second difference values; and based on the third difference, adjust a correction value associated with the first analog level in the LUT memory.

In another example, an analog-to-digital converter includes a first half analog-to-digital converter (HADC) of a delay domain type; a first look-up-table (LUT) memory associated with the first HADC, and storing correction values associated with a plurality of analog levels; a second HADC of the delay domain type; and control logic to adjust correction values associated with the plurality of analog levels in the first LUT memory. The control logic executes a plurality of operations for each of the plurality of analog levels including controlling the first HADC to convert the analog level plus a first offset to a first digital value; controlling the second HADC to convert the analog level plus a second offset to a second digital value; computing a first difference value between the first digital value and the second digital value; controlling the first ADC to convert the analog level minus the first offset to a third digital value; controlling the second ADC to convert the analog level plus the second offset to a fourth digital value; computing a second difference value between the third digital value and the fourth digital value; computing a third difference between the first and second difference values; and based on the third difference, adjusting a correction value associated with the analog level in the first LUT memory.

Example technical advantages enabled by one or more of these examples include a self-referenced background calibration loop for delay-domain ADCs with improved linearity based on correcting systematic integral non-linearity. The effects of mismatches between the calibration path and the signal path in split-ADC architectures can be reduced, and can extend across multiple Nyquist bands of the ADC. Correction for second harmonic distortion due to flicker noise over the input range can also be applied in these examples.

Other technical advantages enabled by the disclosed examples will be apparent to those of ordinary skill in the art having reference to the following specification together with its drawings.

BRIEF DESCRIPTION OF THE DRAWINGS

The same reference numbers or other reference designators are used in the drawings to illustrate the same or similar (in function and/or structure) features.

DETAILED DESCRIPTION

Figure 1:
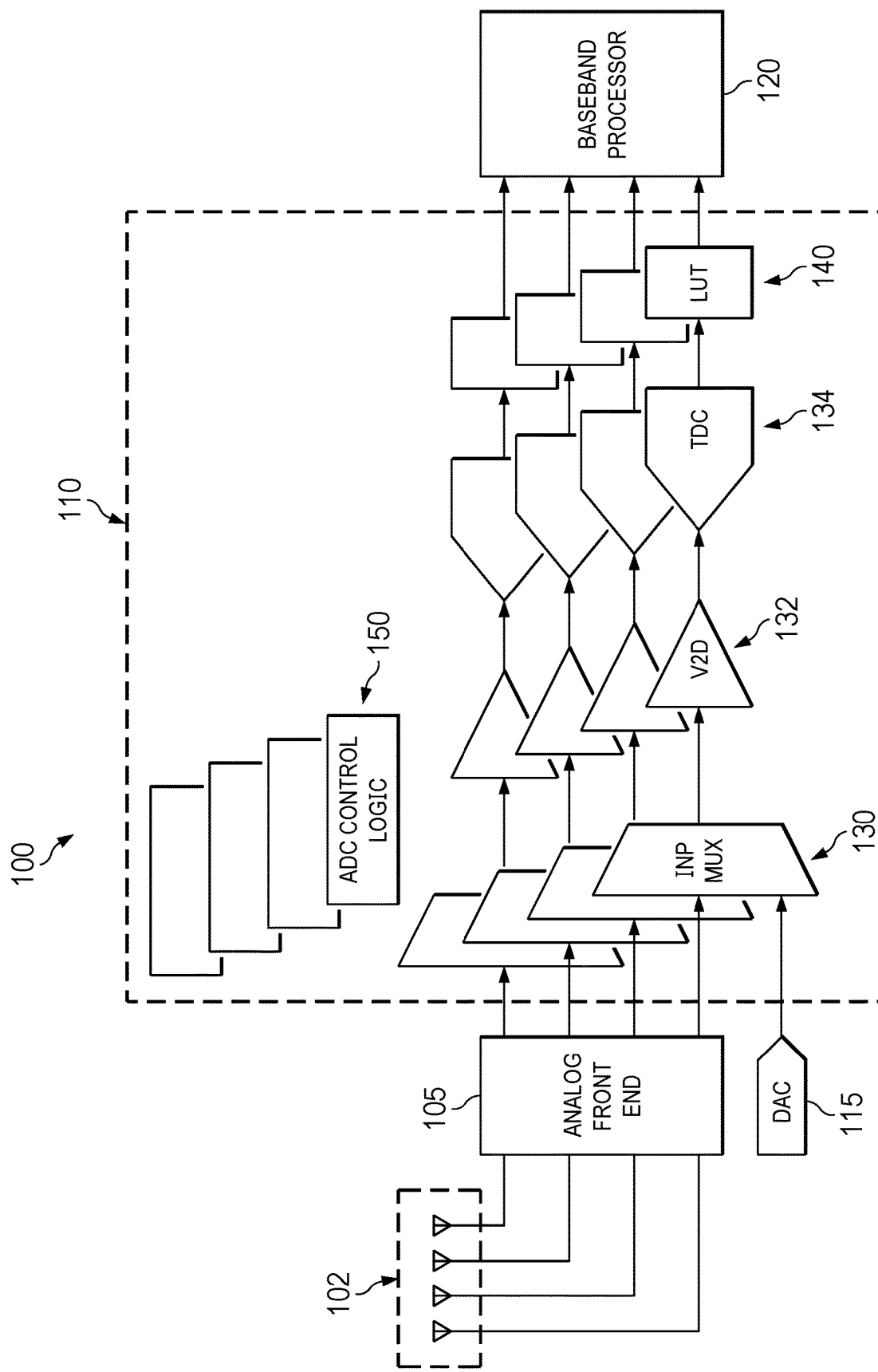
FIG. 1 is an electrical diagram, in block form, of a multi-channel wireless receiver including example delay-domain analog-to-digital converters (ADCs).

FIG. 1 illustrates the architecture of an example multi-channel wireless communications receiver 100. Receiver 100 includes antenna array 102, analog front end (AFE) circuitry 105, baseband processor 120, digital-to-analog converter (DAC) 115, and one or more analog-to-digital converters (ADCs) 110 according to examples described herein. ADCs 110 include one or more input multiplexers 130, one or more voltage-to-delay converter (V2D) stages 132, one or more time-to-digital converter (TDC) stages 134, one or more look-up table (LUT) memories 140, and one or more instances of ADC control logic 150.

In the example of FIG. 1, receiver 100 receives and processes wireless communications signals over four channels. As such, antenna array 102 includes four antennae, each of which is coupled to AFE circuitry 105. AFE circuitry 105 in this example includes circuit elements such as amplifiers, filters, and the like for analog processing of signals received by antenna array 102. In this example, the four signal channels output by AFE circuitry 105 are forwarded to corresponding ones of four ADCs 110. More particularly, each of four outputs of AFE circuitry 105 are coupled to an input of one of four input multiplexers 130. Each of input multiplexers 130 has a second input coupled to an output of DAC 115. DAC 115 may be provided in receiver 100 separately from ADCs 110 as shown in FIG. 1, or alternatively may be included within one or more integrated circuits in which ADCs 110 are implemented. As described below, DAC 115 provides inputs to ADCs 110 for calibration.

High-performance wired and wireless communications systems operate at frequencies on the order of several gigahertz. For real-time communications, such systems also require low latency and, in the case of mobile communications, low power consumption. Data conversion between the analog and digital domains is an important component of such systems. ADCs of the delay domain type have been observed to provide significant power and chip area advantages in high data rate applications such as modern communications receiver equipment.

In this example, ADCs 110 in receiver 100 are delay domain ADCs. V2D stages 132 each have an input coupled to an output of the input multiplexer 130 corresponding to its receive channel. Each V2D stage 132 operates to convert sampled analog signals to delay domain signals. For example, the delay domain signals output by V2D stages 132 may be in the form of one or more conductor pairs that each communicate a pair of pulses with a relative delay corresponding to the amplitude of the sampled input signal. Example of various V2D architectures are provided in U.S. Pat. Nos. 10,284,188; 10,673,453, 11,316,526; 11,387,840; 11,309,903; 11,316,525; 11,438,001; U.S. Patent Application Publication Nos. US2022/0271764; US2022/0224349; US2022/0247420; US2022/0247421; pending U.S. patent application Ser. No. 17/898,844, filed Aug. 30, 2022; and pending U.S. patent application Ser. No. 18/498,358, filed Oct. 31, 2023, each commonly assigned with this application and incorporated by reference herein in its entirety.

Each V2D stage 132 has an output coupled to an input of a corresponding TDC stage 134. Examples of TDC converter architectures suitable for use as TDC 220 in this example are described in U.S. Pat. Nos. 10,673,453; 10,778,243; 11,316,525; 11,387,840; and 11,316,526; U.S. Patent Application Publication Nos. US 2022/0247420; US 2022/0247421; and US 2022/0224349; and pending U.S. patent application Ser. No. 18/174,187, filed Feb. 24, 2023, each commonly assigned with this application and incorporated by reference herein in its entirety.

In ADCs 110 of this example, outputs of each of TDC stages 134 are coupled to inputs of a corresponding LUT memory 140. As mentioned above, delay domain analog-to-digital conversion applies a transfer function that is inherently non-linear due to the conversion of analog input levels to time domain signals (e.g., delay between pulses). LUT memories 140 of ADCs 110 store a mapping between digital values output by TDC stages 134 (which include non-linear distortion) and the digital values (or "codes") corresponding to known input levels, for example as applied by DAC 115 in a calibration routine.

Each ADC 110 includes a corresponding instance of ADC control logic 150. As described below, ADC control logic 150 includes logic circuitry arranged or programmed to control the operation of ADCs 110 in both the conversion of input signals from AFE circuitry 105, and in the calibration of ADCs 110, including the storing of non-linearity corrections in LUT memories 140. Alternatively to each ADC 110 having its own independent implementation of ADC control logic 150, some or all of the control logic functions of ADC control logic may be implemented in a logic circuitry or functions common to all of ADCs 110 in receiver 100. Control logic 150 can be implemented in whole or in part in the form of firmware, by way of programmable logic circuitry in combination with program memory resources storing the appropriate executable instructions, by way of dedicated hardware, or any combination of the above.

The above-incorporated U.S. Pat. No. 11,316,525 describes a delay domain ADC calibration routine in which a LUT memory is loaded (or "filled") with a mapping of digital output values, reflecting the non-linear transfer function of the ADC, to the correct codes following a linear transfer function. In that calibration approach, a number of digital input codes (e.g., $2^N$ codes for an N-bit ADC) are applied to a DAC, which in turn presents analog reference levels to the delay domain ADC (e.g., via an input multiplexer). The ADC converts those reference levels to (N+n)-bit digital values according to its transfer function, which has non-linearities inherent in delay domain conversion. The calibration routine "fills" the LUT memory with a mapping between the (N+n)-bit output words and the N-bit input codes applied to the DAC, which follow a linear relationship. In normal operation, digital values output by the TDC stage for each input sample address the LUT memory, which outputs the correct (linear) codes according to the stored mapping.

However, mismatch between the calibration path (e.g., the DAC and input multiplexers) and the signal path (e.g., from the output of analog front end circuitry through input multiplexers), however small, presents a systematic non-linearity in the calibration of delay domain ADCs. This systematic non-linearity is due to factors such as device (e.g., transistor) mismatches, and is exacerbated by variations in manufacturing process parameters, power supply and signal voltages, and temperature (PVT). As a result, the calibration of ADCs based on analog reference levels may not correct non-linearities to the full extent required in high data rate applications. It is within this context that the examples described herein arise.

In the examples described herein, the contents of LUT memories 140 in ADCs 110 are further corrected for these systematic non-linearities between the calibration path (e.g., DAC 115 and input multiplexers 130) and the signal path (e.g., from the output of AFE circuitry 105 through input multiplexers 130).

Figure 2:
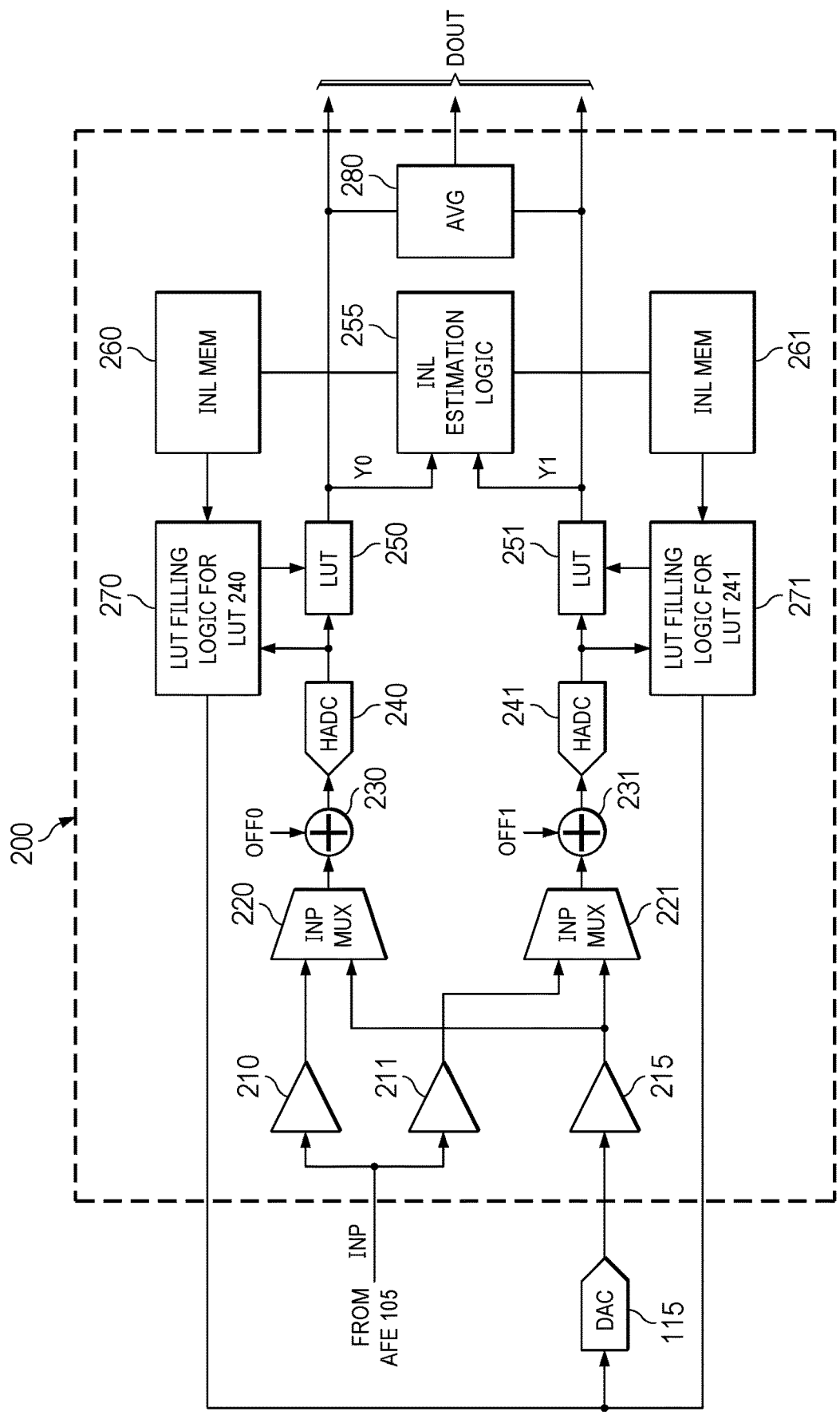
FIG. 2 is an electrical diagram, in block form, of an example delay-domain ADC.

FIG. 2 illustrates the construction of an example delay domain ADC 200. In particular, FIG. 2 illustrates the construction of ADC 200 in connection with its calibration and non-linearity correction in the described examples, and also in connection with its signal path. ADC 200 of FIG. 2 may correspond to one of ADCs 110 in the receiver of FIG. 1 described above.

ADC 200 of FIG. 2 includes input buffers 210, 211, DAC input buffer 215, input multiplexers 220, 221, adders 230, 231, half ADCs (HADCs) 240, 241, LUT memories 250, 251, integral non-linearity (INL) estimation routine logic 255, INL memories 260, 261, LUT filling logic 270, 271, and output averaging circuit 280. FIG. 2 illustrates ADC 200 in combination with DAC 115, in this context in which DAC 115 is external to ADC 200 (e.g., implemented on the same integrated circuit as ADC 200, or implemented in a separate integrated circuit). Alternatively, ADC 200 may itself include DAC 115.

In this example, HADCs 240, 241 each include both a V2D stage (e.g., corresponding to V2D stage 132 of FIG. 1) and a TDC stage (e.g., corresponding to TDC stage 134 of FIG. 1).

Referring to the HADC 240 side of ADC 200 as an example, input buffer 210 has an input coupled to an output of AFE circuitry 105 (FIG. 1). Input buffer 210 includes buffer circuitry and sample-and-hold circuitry, arranged to sample analog signals (e.g., voltages) at its input at a selected sample rate, and present a sample stream to an input of input multiplexer 220.

A second input of input multiplexer 220 is coupled to an output of DAC buffer 215. DAC buffer 215 has an input coupled to an output of DAC 115. Similar to input buffer 210, DAC buffer 215 includes buffer circuitry and (if necessary) sample-and-hold circuitry arranged to present sampled analog signals (e.g., voltages) to the second input of input multiplexer 220.

The output of input multiplexer 220 is coupled to an input of adder 230. As described below, in part of a calibration operation, adder 230 selectively adds a selected offset value off0 to the signal sample at the output of input multiplexer 220. During conversion of input signals, adder 230 may be disabled (or add a "0" value). The output of adder 230 is coupled to an input of HADC 240.

HADC 240 has an output coupled to an address input of LUT memory 250, in the manner described above in connection with FIG. 1. LUT memory 250 has an output presenting a digital output word y0, which is coupled to an input of INL estimation logic 255, an input of output averaging circuit 280, and to output OUT of ADC 200 (e.g., coupled to downstream circuitry such as baseband circuitry 120 of FIG. 1).

The arrangement and operation of HADC 241 in combination with input buffer 211, input multiplexer 221, adder 231 (selectively adding an offset off1 in calibration routines), and LUT memory 251, are similar to that described above for HADC 240 and its signal and calibration path circuitry. Accordingly, input multiplexers 220 and 221 together correspond to an instance of input multiplexers 130 in receiver 100 (FIG. 1), HADCs 240, 241 together correspond to an instance of each of V2D stages 132 and TDC stages 134 in receiver 100, and LUT memories 250, 251 together correspond to an instance of LUT memories 140 in receiver 100. LUT memory 251, associated with HADC 241, has an output coupled to an input of INL estimation logic 255, to an input of output averaging circuit 280, and to output OUT of ADC 200. The output of LUT memory 251 presents a digital output word y1.

Logic functions of ADC 200 including INL estimation routine logic 255, INL memories 260, 261, LUT filling logic 270, 271, and output averaging circuit 280 correspond to an instance of control logic 150 in receiver 100 of FIG. 1. Other control logic functions may also be included in instances of control logic 150, including control of the selections made by input multiplexers 220, 221, and control of adders 230, 231 to select and selectively apply the offsets off0, off1 as described below.

In the architecture of ADC 200 in FIG. 2, one of HADCs 240, 241 may be converting an input signal sample from AFE circuitry 105 at the same time as the other is being calibrated based on a reference analog signal output by DAC 115. In such "background" calibration, the output of the one of HADCs 240, 241 that is converting an input signal sample is forwarded via output OUT, while the output of the HADC being calibrated is masked or disabled from being output. During such times as both of HADCs 240, 241 are converting an input signal sample, output averaging circuitry 280 computes an average of the two outputs y0, y1, and presents that average as a digital output word at output OUT.

In these examples, control logic 150 includes functionality that corrects the contents of LUT memories 250, 251 for systematic non-linearity, for example between the calibration path and the signal path of ADC 200. This functionality is illustrated in FIG. 2 as adders 230, 231, INL estimation logic 255, INL memories 260, 261, and portions of LUT filling logic 270, 271. In the arrangement of FIG. 2, INL estimation logic 255 has inputs receiving the digital output words y0, y1 from LUT memories 250, 251, respectively. INL estimation logic 255 has outputs coupled to inputs of INL memories 260, 261. Outputs of INL memories 260, 261 are coupled to LUT filling logic 270, 271.

INL estimation logic 255 in this example operates to determine estimates of systematic non-linearity for mismatches between the calibration and signal paths in ADC 200, for both of HADCs 240, 241. These estimates of system INL are obtained by INL estimation logic 255 for each of HADCs 240, 241 using the other HADC as a reference.

Figure 3:
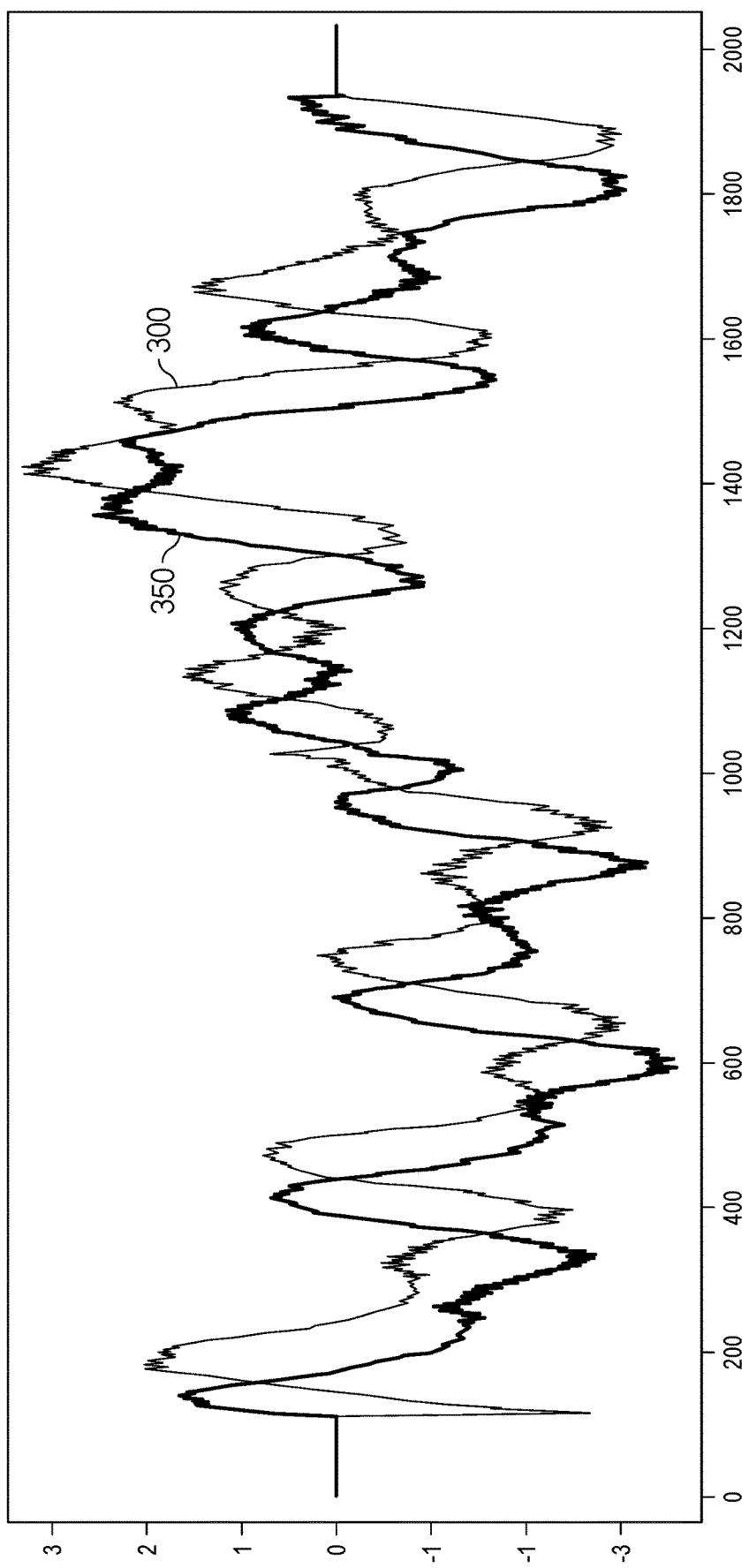
FIG. 3 illustrates plots of integral non-linearity (INL) over an input range of a delay-domain ADC at positive and negative offsets.

INL estimation in this example is based on determinations of delay domain non-linearity over a range of analog input levels at positive and negative offsets. FIG. 3 illustrates an example of non-linearity for an 11-bit delay domain ADC over a portion of its input range by way of plots 300, 350. Plot 300 illustrates residual non-linear error of the ADC over known input levels x plus an offset value off (e.g., x+off) after removal of the fundamental and offset contributions to the output value. Plot 350, on the other hand, illustrates this residual non-linear error over the same known input levels x minus the offset value off (e.g., x−off). For an ideally linear ADC, the difference between the residual error plots at the different offsets, namely the difference in error at input levels x+off and x−off, would be zero. Conversely, this difference in error can serve as an estimate of the INL for a non-ideal ADC. In this example, INL estimation logic 255 uses an observation of this error difference between positive and negative offsets to estimate the INL for ADC 200, and to adjust the contents of LUT memories 250, 251 accordingly.

The output $y_{0+}$ of HADC 240 from the conversion of an input level x from DAC 115 plus an offset off0 (as added by adder 230) may be expressed as:

$$y_{0+} = (1 + a_0)x + \text{mean}_0 + INL_0((1 + a_0)x + \text{mean}_0 + \textit{off}0) \qquad (1)$$

where $a_0$ is the gain error of HADC 240, $\text{mean}_0$ is the channel offset error of HADC 240, and the $INL_0$ term is the residual non-linearity of HADC 240.

Theoretically, one could determine the difference between output $y_{0+}$ from HADC 240 in response to input level x+off0, and an output $y_{0-}$ from HADC 240 in response to an input level x−off0 (input level x minus the same offset off0). However, these two output results $y_{0+}$ and $y_{0-}$ are not available from HADC 240 at the same time. Variations in input level x from the time that output $y_{0+}$ is generated to the time at which output $y_{0-}$ is generated, as can occur in practice, would "leak" into the determination of INL for HADC 240.

In this example, HADC 241 is used as a reference in determining the INL of HADC 240. Conversely, HADC 240 is used as a reference in determining the INL of HADC 241. For the case of INL determination for HADC 240 as exemplary, the output of $y_{1+}$ of HADC 241 in response to the same analog input level x from DAC 115 (applied at the same time as to HADC 240) plus an offset off1 (as added by adder 231) may be expressed as:

$$y_{1+} = (1 + a_1)x + \text{mean}_1 + INL_1((1 + a_1)x + \text{mean}_1 + \textit{off}1) \qquad (2)$$

where $a_1$ is the gain error of HADC 241, $\text{mean}_1$ is the channel offset error of HADC 241, and the $INL_1$ term is the residual non-linearity of HADC 241. By acquiring output values $y_{0+}$ and $y_{1+}$ simultaneously or as close in time as possible, any error due to time-dependent variations can be avoided. Offset off1 is not necessarily the same amplitude and polarity as offset off0, but is an arbitrary magnitude of either polarity or zero offset. One may express a difference $estp(x) = y_{0+} - y_{1+}$ between these two outputs $y_{0+}$ and $y_{1+}$, acquired at substantially the same time for the input level x, as:

$$estp(x) = (a_0 - a_1)x + \text{mean}_0 - \text{mean}_1 + INL_0(x1 + \textit{off}0) - INL_1(x1 + \textit{off}1) \qquad (3)$$

where $x1 \approx (1+a_0)x + \text{mean}_0$.

At a next point in time, an analog input level x from DAC 115 minus the offset off0 may be converted by HADC 240 to produce an output value $y_{0-}$:

$$y_{0-} = (1 + a_0)x + \text{mean}_0 + INL_0((1 + a_0)x + \text{mean}_0 - \textit{off}0) \qquad (4)$$

At substantially the same time as output value $y_{0-}$ is generated by HADC 240, another instance of output value $y_{1+}$ may be obtained from the conversion, by HADC 241, of input level x plus the same offset off1 (with the same polarity) as used previously in determining difference estp. Again, by acquiring output values $y_{0-}$ and $y_{1+}$ simultaneously or as close in time as possible, any error due to time-dependent variations can be avoided. A difference $estm(x) = y_{0-} - y_{1+}$ between output values $y_{0-}$ and $y_{1+}$ may be expressed as:

$$estm(x) = (a_0 - a_1)x + \text{mean}_0 - \text{mean}_1 + INL_0(x1 - \textit{off}0) - INL_1(x1 + \textit{off}1) \qquad (5)$$

An estimate of a differential INL DiffINL(x) for HADC 240, at input level x, may be determined from the difference between the differences estp(x) and estm(x):

$$DiffINL(x) = estp(x) - estm(x) = INL_0(x1 + \textit{off}0) - INL_0(x1 - \textit{off}0) \qquad (6)$$

As evident from equations (3) and (5), many of the terms of differences estm(x) and estp(x) effectively cancel out in the subtraction of equation (6). These cancelling terms include the gain error terms $(a_0-a_1)x$ and the mean channel error terms $\text{mean}_0-\text{mean}_1$. The terms remaining in differential INL DiffINL(x) for HADC 240 amount to the INL difference at positive and negative offsets around input level x. As described above relative to FIG. 3, this differential INL DiffINL(x) would be zero for an ideal linear ADC. A non-zero differential INL DiffINL(x) conversely indicates an estimate for the integral non-linearity INL for HADC 240 at input level x. In addition, any variations in the input level x between the different points in time at which HADC 240 generates the output values $y_{0+}$ and $y_{0-}$ are effectively cancelled out of the INL determination, due to the subtraction of the same reference value $y_{1+}$ generated by HADC 241 at both points in time, according to equations (3) and (5).

Figure 4:
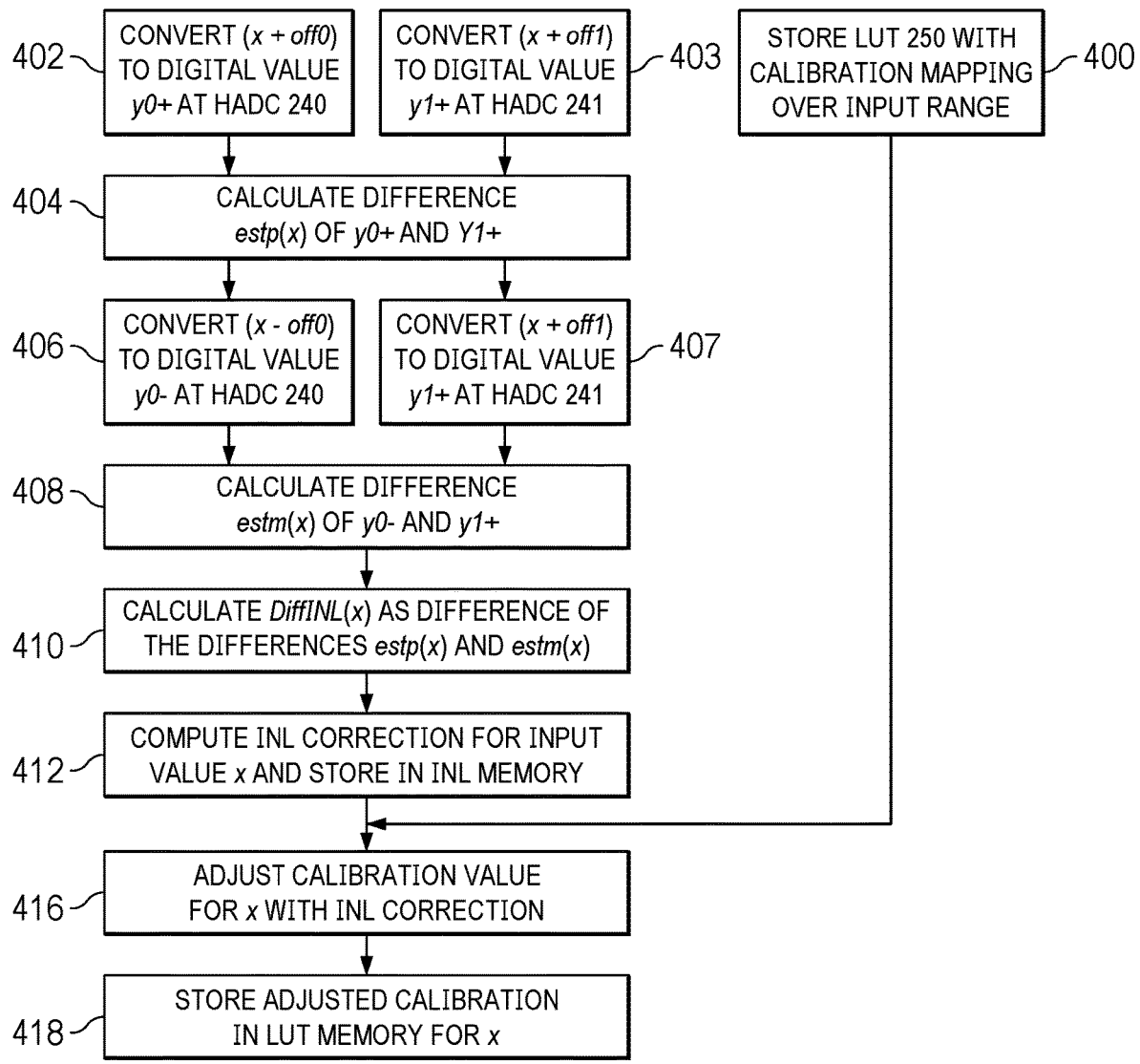
FIG. 4 is a flow diagram illustrating an example method of determining an integral non-linearity (INL) correction at an input level x.

FIG. 4 illustrates an example method of adjusting contents of an entry in LUT memory 250 according to an estimate of INL for HADC 240 at a given input level. In process block 400, LUT memory 250 is initially filled with a calibration value for input levels over the input range of ADC 200, for example in a calibration routine. For example, DAC 115 applies an analog input level to HADC 240 via input multiplexer 220, in response to which HADC 240 produces a converted digital output value. In process block 400, LUT filling logic 270 stores, in LUT memory 250, a mapping between the digital output values from HADC 240 and the corresponding codes for the input levels applied to DAC 115. An example of this calibration routine is described in the above-incorporated U.S. Pat. No. 11,316,525.

In process block 402, HADC 240 converts an analog input level x (e.g., as output by DAC 115 in response to a corresponding input code) plus an offset off0 as added to input level x by adder 230. Adder 230 may be implemented in the analog domain, for example by a circuit applying an imbalance at the input of HADC 240. The magnitude of offset off0 may be on the order of several codes in the input range of ADC 200. For example, if ADC 200 is an 11-bit ADC, the magnitude of offset off0 may be on the order of thirty-two codes from the code corresponding to input level x. HADC 240 converts the analog level x+off0 to a digital value y0+ in process block 402. For example, digital value y0+ may be represented by an N+n-bit digital value for N-bit ADC 200 (e.g., N=11 bits, and n=5 bits).

In process block 403, HADC 241 converts analog input level x plus an offset off1 as added to input level x by adder 231. Process block 403 may be performed at the same time as process block 402, for example with the same input level x simultaneously presented by DAC 115 to both input multiplexers 220, 221 and adders 230, 231. Offset off1 may be positive or negative in polarity, or may be a "zero" offset (e.g., no offset at all). As in the case of adder 230, adder 231 may be implemented in the analog domain, for example by a circuit applying an imbalance at the input of HADC 241. HADC 241 converts the analog level x+off0 to an N+n-bit digital value y1+ in process block 403.

In process block 404, logic circuitry in ADC 200, for example INL estimation logic 255, computes a difference estp(x) from the subtraction of the digital values y0+ and y1+ (e.g., y0+−y1+), according to equation (3).

In process block 406, HADC 240 converts an analog level corresponding to input level x minus the offset off0 to digital value y0−. The offset off0 subtracted in process block 406 is at the same amplitude as the offset off0 added in process block 402. In process block 407, HADC 241 converts an analog level corresponding to the input level x plus the same offset off1 as in process block 403 to another instance of digital value y1+. This second conversion of input level x+off1 in process block 407, when performed at substantially the same time as process block 406, avoids error in the INL estimation due to time-dependent variations in input level x in the calibration path from DAC 115. In process block 408, INL estimation logic 255 or other logic circuitry in ADC 200 computes a difference estm(x) from the subtraction of the digital values y0− and second instance of y1+ (e.g., y0−y1+), according to equation (5).

In process block 410, INL estimation logic 255 calculates a differential INL value DiffINL(x) for HADC 240 at the input level x from the differences estp(x) and estm(x) calculated in process blocks 404 and 408. In this example, differential INL value DiffINL(x) for HADC 240 at the input level x is calculated in process block 410 as the difference estp(x)−estm(x), according to equation (6). In process block 412, an INL correction at input level x for HADC 240 is computed from the differential INL value DiffINL(x) result calculated in process block 410, and is stored in INL memory 260 in association with input level x.

In process block 416, LUT filling logic 270 adjusts the calibration value previously stored in LUT memory 250 for input level x (e.g., in process block 400) by a correction for INL based on the differential INL value DiffINL(x) calculated in process block 410. For the example of a LUT memory 250 storing a mapping between the output of HADC 240 and the "true" digital value (e.g., as applied to the input of DAC 115 to generate input level x), LUT filling logic 270 adjusts the mapped value for input level x in LUT memory 250 according to the differential INL value DiffINL(x). This correction accounts for systematic non-linearity due to mismatches between the calibration path and the signal path through in ADC 200 on the side of HADC 240. In process block 418, the result of process block 416 is stored in the memory location in LUT memory 250 corresponding to input level x for HADC 240.

The flow diagram of FIG. 4 describes a method as applied to a single input level x for which INL is estimated and the contents of LUT memory 250 are adjusted. In practice, this same estimation and adjustment is performed for HADC 240 over a number of input levels, for example at a desired resolution over the input range of ADC 200.

In another example, improved efficiency in the estimation of INL and adjustment of LUT mappings can be attained based on a recognition that, in general, INL changes gradually from input code to input code. In this example, an INL estimate is derived and applied as the correction over a "bin" of neighboring codes corresponding to a "zone" of the analog input range of ADC 200. In this description, the term "zone" refers to a region of the analog input range, and the term "bin" refers to a group of input codes corresponding to a given zone of the input range.

In this example, if the input range of ADC 200 is divided into k bins of j codes each, a single INL estimate INLest(k) can be derived and applied to LUT memory 250 for each code in the $k^{th}$ bin of j codes:

$$INLest(k) = \sum_{i=1}^{j} DiffINL(i) \tag{7}$$

This INL estimate INLest(k) amounts to an integration of the differential INL values DiffINL(x) over the corresponding zone of the input range of ADC 200 covered by the j codes in bin k.

The INL estimates INLest(k) derived for each bin k in the input range of ADC are used to adjust the mapping in LUT memories 250 and 251. In these examples, this adjustment is performed by adding the INL estimate INLest(k) derived for a given bin k to the current contents of LUT memories 250, 251 associated with each input code for that bin k. For example, an adjusted value LUT$_{corr}$(x) associated with an input level x in one of LUT memories 250, 251 may be expressed as:

$$LUT_{corr}(x) = LUT_0(x) + INLest(x) \qquad (8)$$

where LUT$_0$(x) represents the contents of the LUT memory at input level x from a standard calibration operation (e.g., without further adjustment for INL in these examples), and INLest(x) is the INL estimate derived for the bin including input level x. This addition can be performed by LUT filling logic 270, 271 using the current contents of LUT memories 250, 251, and the contents of INL memories 260, 261, respectively.

Figure 5:
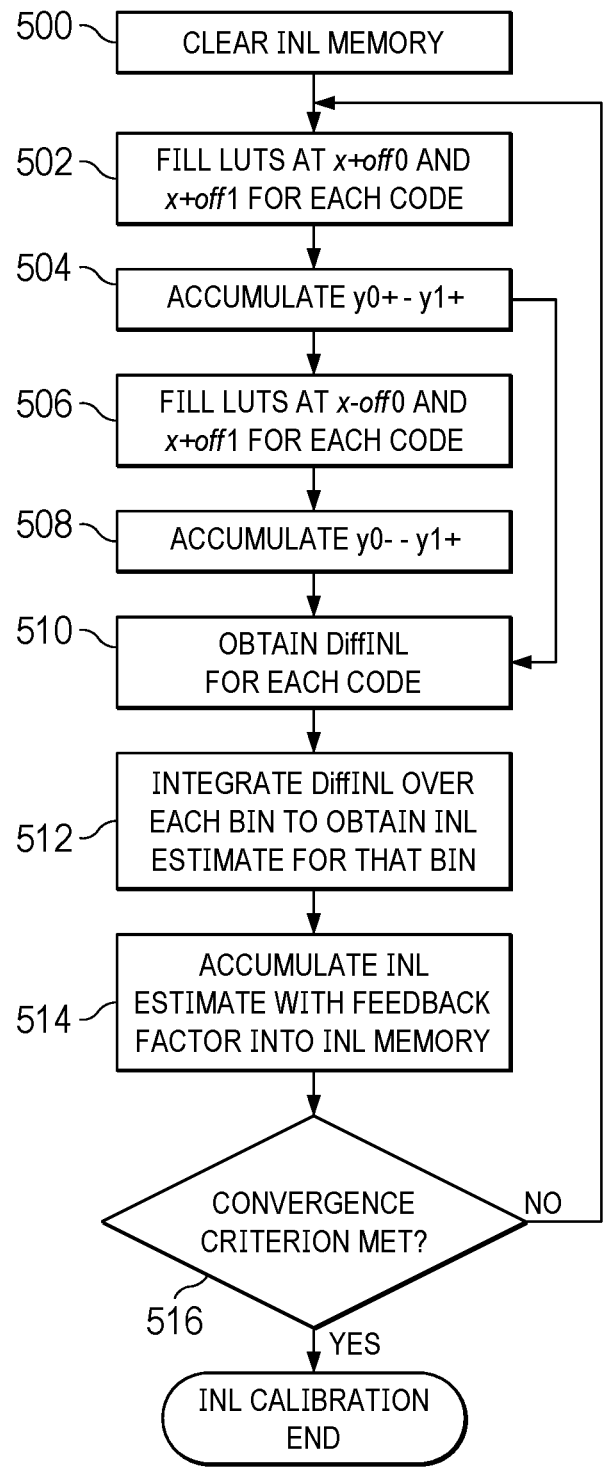
FIG. 5 is a flow diagram illustrating an example method of iterative INL correction of entries in a LUT memory.

FIG. 5 is a flow diagram illustrating an example method of estimating INL by bins over the input range of HADC 240 in ADC 200. The number of codes in each bin, and thus the number and widths of zones in the ADC input range, can be selected according to a tradeoff between noise and resolution. Narrow zones (fewer codes per bin and thus more bins) can increase the resolution at which INL is correctable, but can cause the INL estimate to be more prone to noise. Wider zones (more codes per bin and thus fewer bins) can reduce the noise vulnerability of the estimate and reduce the computational and memory requirements, but can limit the ability to correct for sudden changes in INL within the zone. In an example for an 11-bit ADC 200, the amplitude of the offsets (off0 and off1) is selected so that the difference between positive and negative offsets equals 32 codes. The bin width in this example is selected to the same size as this shift, resulting in 32 bins of 64 codes each. The input range of ADC 200 is thus divided into 32 zones.

In this example, the method of FIG. 5 is executed in ADC 200 under the control of INL estimation logic 255 and LUT filling logic 270 of control logic 150, for example as part of a background calibration routine applied to ADC 200. INL estimation logic 255 can be implemented in the form of firmware, or alternatively may be implemented by way of programmable logic circuitry in combination with program memory resources storing the appropriate executable instructions for the described estimation method. In addition or in the alternative, dedicated hardware (e.g., accumulators) can be provided in or in conjunction with control logic 150.

The example method of FIG. 5 begins in process block 500, in which INL memory 260 for HADC 240 is cleared. Alternatively, process block 500 may operate to clear INL memory 260 for all bins, setting the contents of INL memory 260 for each bin to zero.

Process block 502 corresponds to process blocks 402 and 403 of FIG. 4 performed successively for each code of the input range. At each code, HADC 240 operates in process block 502 to fill the contents of LUT memory 250 by HADC 240 converting the corresponding input level x plus offset off0 to a digital result y0+. This result y0+, plus the contents of INL memory 260 for that input code (such contents being zero for this first pass through process block 502), is stored in LUT memory 250 in association with the input code associated with that input level x. At substantially this same time, HADC 241 similarly operates in process block 502 to fill the contents of its LUT memory 251 by converting input level x plus offset off1 for the same input code and storing the result y1+ in LUT memory 260 in association with input level x.

Process block 504 corresponds to process block 404 of FIG. 4. In process block 504, INL estimation logic 255 computes a difference estp(x) according to equation (3) between the converted results y0+ and y1+ from process block 502 at each input level x. Process block 504 may be performed by dedicated hardware accumulators in INL estimation logic 255. For the example in which 32 bins are defined, thirty-two accumulators may be provided, one accumulator assigned to each bin. In this example, a difference of the converted results y0+ and y1+ from process block 502 for the input code of input level x (with offsets) is calculated and accumulated by the accumulator assigned to the bin including that code. In some examples, this subtraction of process block 504 at each input code may be performed immediately following the conversions of process block 502 for that code.

Process block 506 corresponds to process blocks 406 and 407 of FIG. 4, performed successively for each code of the input range. In process block 506, HADC 240 fills the contents of LUT memory 250 by converting input level x minus offset off0, and storing the result y0–, plus the contents of INL memory 260 for the code corresponding to that input level x, in LUT memory 250 in association with the input level x. At substantially this same time in process block 506, HADC 241 fills the contents of its LUT memory 251 by converting input level x plus offset off1 for each code in the current bin, and storing the result y1+ in its LUT memory 251.

Process block 508 corresponds to process block 408 of FIG. 4. In process block 508, INL estimation logic 255 computes a difference estm(x) according to equation (5) between the converted results y0– and y1+ from process block 506 at each input level x. Again, process block 508 may be performed by the dedicated hardware accumulators in INL estimation logic 255, and may be performed for each input code immediately following the conversions of process block 506 for that code.

Process block 510 corresponds to process block 410 of FIG. 4. In process block 510, INL estimation logic 255 computes a differential INL estimate DiffINL(x) for each input level x as the difference between differences estp(x) and estm(x) from process blocks 504, 506 for that input level x.

In process block 512, INL estimation logic 255 integrates the differential INL estimates DiffINL(x) over the j codes of each of the k bins. This integration may be performed by INL estimation logic 255 according to equation (7), for example by adding the differential INL estimates DiffINL(x) within each bin. In this example, the result of integration process block 512 is an INL estimate INLest(k) for each of the k bins. This INL estimate INLest(k) applies to each of the j codes within a given bin k.

In the example of FIG. 5, the determination of INL estimates is performed iteratively. Accordingly, in process block 514 the INL estimates INLest(k) obtained in process block 512 for each bin is accumulated into INL memory 260 for HADC 240 with a feedback factor (e.g., a factor μ<1) applied to the estimates from the iteration just completed. Decision block 516 determines whether a convergence criterion has been met for this iterative process. The convergence criterion may be a convergence limit. For example, the highest INL estimate INLest(k) for any of the bins, or an averaged (e.g., root-mean-square) value of the INL estimates over all of the bins, may be compared with a preselected convergence limit. Alternatively or in addition, a predetermined number of iterations may be performed (e.g., four or five iterations). If the convergence criterion is not met (decision block 516 returns a "no" result), the next iteration of the process is performed from process block 502. In this next iteration, the contents of INL memory 260 are included in the filling of LUT memories 250, 251 in process blocks 502 and 506, so that the next INL estimates INLest(k) are incremental estimates relative to those previously accumulated.

If the convergence criterion is met (decision block 516 returns a "yes" result), calibration of HADC 240 in ADC 200 for systematic non-linearity, for example between the calibration path and the signal path, is complete.

As mentioned above, INL estimation in the method of FIG. 5 takes advantage of the generally gradual changes in INL with codes over the range of ADC 200 by performing a single overall estimate for a bin or zone of adjacent codes. The approach of FIG. 5 can reduce the computational requirements of the calibration logic in the ADC, and smooth out noise in the ADC estimations within a given bin. In addition, the use of hardware accumulators in this approach reduces the memory and thus chip area required to obtain the improved measure of integral non-linearity.

Figure 6:
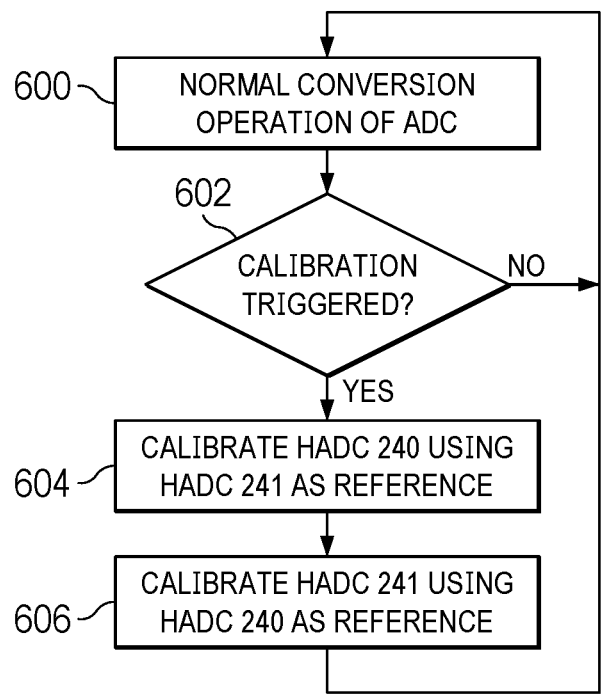
FIG. 6 is a flow diagram illustrating an example method of calibrating both half ADCs (HADCs) in an example ADC according to FIG. 2.

FIG. 4 and FIG. 5 have described the estimation of INL in these examples in connection with one of the HADCs in ADC 200, namely the estimation of INL for HADC 240 using HADC 241 as a reference. Similar estimation of INL is also performed for HADC 241, using HADC 240 as a reference. FIG. 6 illustrates a method of overall calibration in the operation of ADC 200.

In process block 600 of FIG. 6, ADC 200 carries out its normal operation of converting sampled analog signals. For the example receiver 100 of FIG. 1, this normal operation of process block 600 involves the conversion of received signals from antenna array 102, with input multiplexer 130 selecting the outputs of AFE circuitry 105 for forwarding to V2D stages 132 and TDC stages 134.

Decision block 602 determines whether calibration of ADC 200 has been triggered. Examples of trigger events may include the elapse of a predetermined time interval since the last calibration, or alternatively receipt of error indications from downstream circuitry (e.g., baseband processor 120 in receiver 100). If calibration is not triggered (decision block 602 returns a "no" result), normal conversion continues in process block 600.

If calibration of ADC 200 has been triggered (decision block 602 returns a "yes" result), process block 604 is executed to calibrate HADC 240 using HADC 241 as a reference, following the processes described above relative to FIG. 4 and FIG. 5. Process block 606 is also executed to calibrate HADC 241 using HADC 240 as a reference. The processes described above relative to FIG. 4 and FIG. 5 are applied to HADC 241 in process block 606 in the same manner as applied to HADC 240 in process block 604. The order in which process blocks 604 and 606 are executed is of course irrelevant.

Following the calibration of both HADC 240 and HADC 241 in process blocks 604 and 606, normal conversion of received signal samples is again carried out from process block 600.

As described above, the error estimates (e.g., differences estp(x) and estm(x) from process blocks 504, 506) are obtained at different times for a given input level x. In practice, however, drift in channel gain and channel offset can be present over the time between these estimates. This drift has been observed to be due to flicker noise (e.g., "1/f noise") in transistors and other circuit components used to implement ADC 200.

Figure 7A:
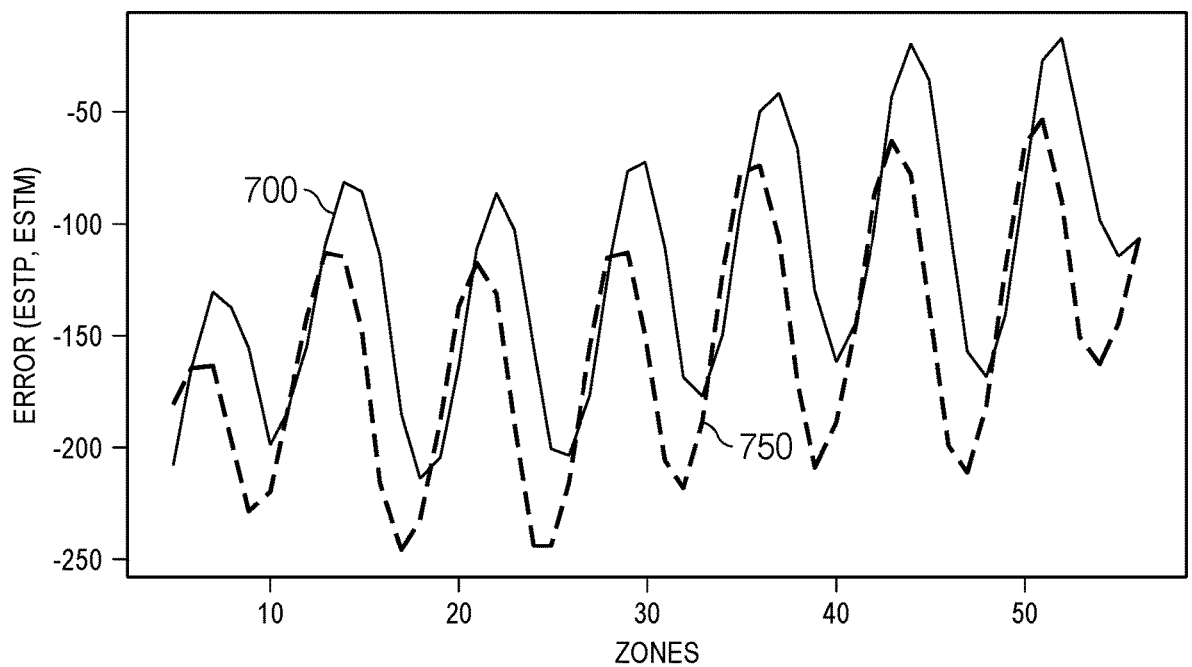
FIGS. 7A and 7B illustrate example plots of error due to flicker noise in a delay-domain ADC, shown at positive and negative offsets.
Figure 7B:
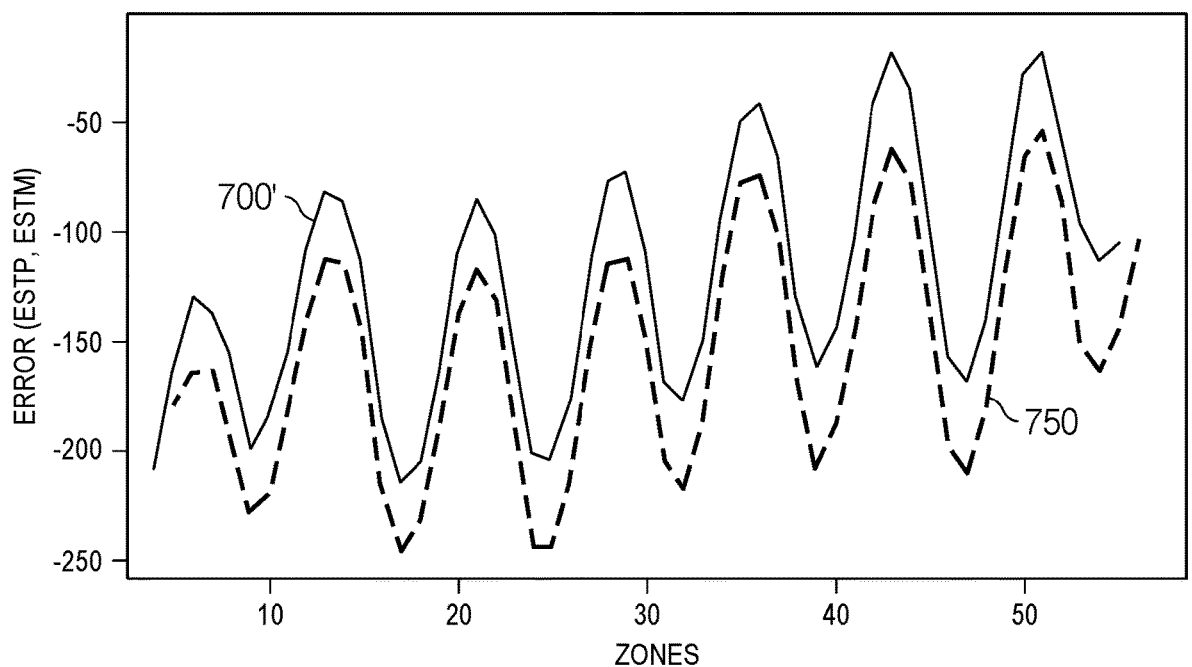

FIG. 7A and FIG. 7B illustrate the effect of this drift. In FIG. 7A, plot 700 illustrates difference estp(x), at positive offset, and plot 750 illustrates difference estm(x), at negative offset, over zones of an example ADC input range. As expected, plot 700 has a similar shape as plot 750, but appears at higher-valued codes corresponding to the difference in offset between the two plots. FIG. 7B illustrates plots 700' and 750, with plot 700' corresponding to plot 700 of FIG. 7A shifted in time (e.g., by twice the offset) to align with plot 750. If no drift were present, plots 700' and 750 would effectively overlay one another. In the example of FIGS. 7A and 7B, however, it is evident that the error differences estp(x) and estm(x) differ from one another in the same direction over the input range. This difference between differences estp(x) and estm(x) is caused by drift in the channel gain and channel offset due to flicker noise as noted above.

Figure 7C:
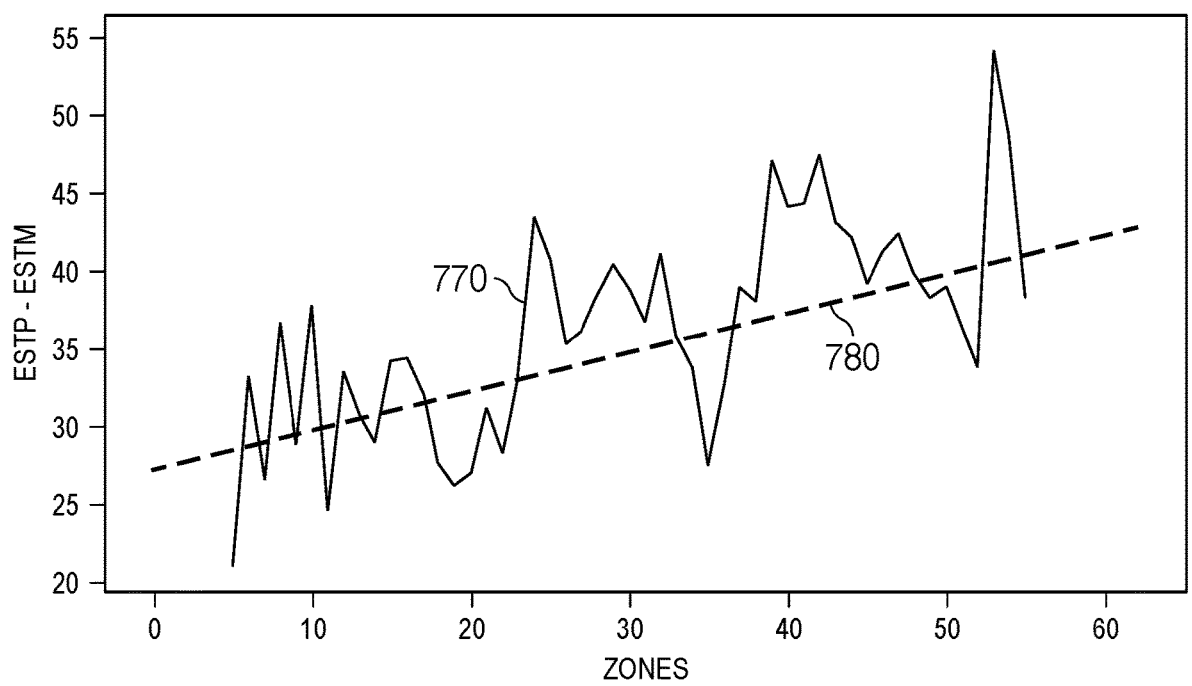
FIG. 7C illustrates an example regression of increasing flicker noise error over the input range of a delay-domain ADC.

As somewhat evident from FIG. 7B, the magnitude of the difference between differences estp(x) and estm(x) is increasing over zone in this example. FIG. 7C includes plot 770 of this magnitude between differences estp(x) and estm(x) from FIGS. 7A and 7B over the zones of the input range. Linear regression of plot 770 is illustrated by line 780 in FIG. 7C, and can be used to characterize this drift in ADC 200 as increasing over the zones of the input range. Because of the summation of differential INL estimates DiffINL in integration process block 512, this drift causes second harmonic distortion in the digital output stream from ADC 200.

Figure 8:
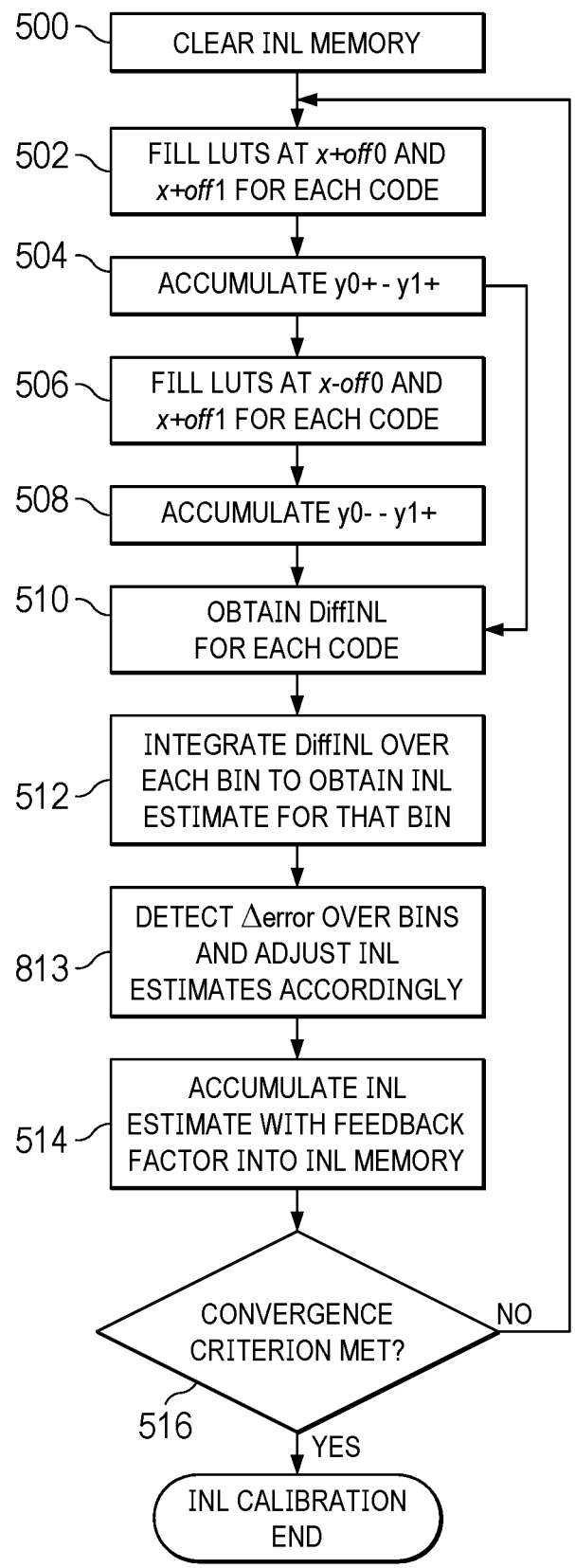
FIG. 8 is a flow diagram illustrating an example method of applying a flicker noise correction in the method of FIG. 5.

FIG. 8 is a flow diagram illustrating an example method of correcting for these second harmonic effects of drift in ADC 200. In this example of FIG. 8, such correction is shown in the context of the example method of FIG. 5. Many of the same process and decision blocks from the example method of FIG. 5 are similarly executed in the example method of FIG. 8. Those same process and decision blocks are shown in FIG. 8 using the same reference numerals as in FIG. 5.

In addition to the process and decision blocks described above in connection with FIG. 5, the example method of FIG. 8 includes process block 813. Process block 813 in this example follows integration process block 512 in which the differential INL estimates DiffINL(x) are integrated (e.g., added according to equation (8)) over the j codes of each bin to obtain INL estimates INLest(k). In process block 813, a measure of the rate of change Δerror over the zones of the input range in the difference between differences estp(x) and estm(x) is determined. If this rate of change Δerror is significant (e.g., in excess of some minimum limit), a correction is applied in process block 813 to the INL estimates INLest(k) for each bin. That correction will correspond to the expected difference in INL estimate at later bins along the input range, based on the detected rate of change Δerror.

Following the correction of process block 813, process block 514 is then executed as before, to accumulate the INL estimates INLest(k) as adjusted in process block 813, with the feedback factor m, into INL memory 260, 261 for the HADC 240, 241, respectively, being evaluated. The convergence criterion is tested in decision block 516, and the process repeated (decision block 516 returns "no") or ended (decision block 516 returns "yes") depending on the result.

In this example method of FIG. 8, second harmonic effects in the digital output of ADC 200 can be significantly reduced by the correction for drift due to flicker noise. As described above, this reduction in second harmonics is attained based on characterization of the harmonic behavior of the delay-domain ADC.

In similar manner, the approach in the example of FIG. 8 can be applied to distortion in the digital output of ADCs at higher harmonics. Reduction in those higher harmonics can be attained in this manner from characterization of the ADC, and correction in the INL estimates (e.g., per bin, as in process block 813 of FIG. 8) based on such characterization.

In another example, other types of errors in ADC 200 may be corrected using the approach to INL estimation described above. In this example, circuitry in the ADC is adjusted based on the fitting of estimated INL to a known error profile. Correction of ADC circuitry in this example may be applied in addition to or in the alternative to the LUT adjustment described above.

Figure 9:
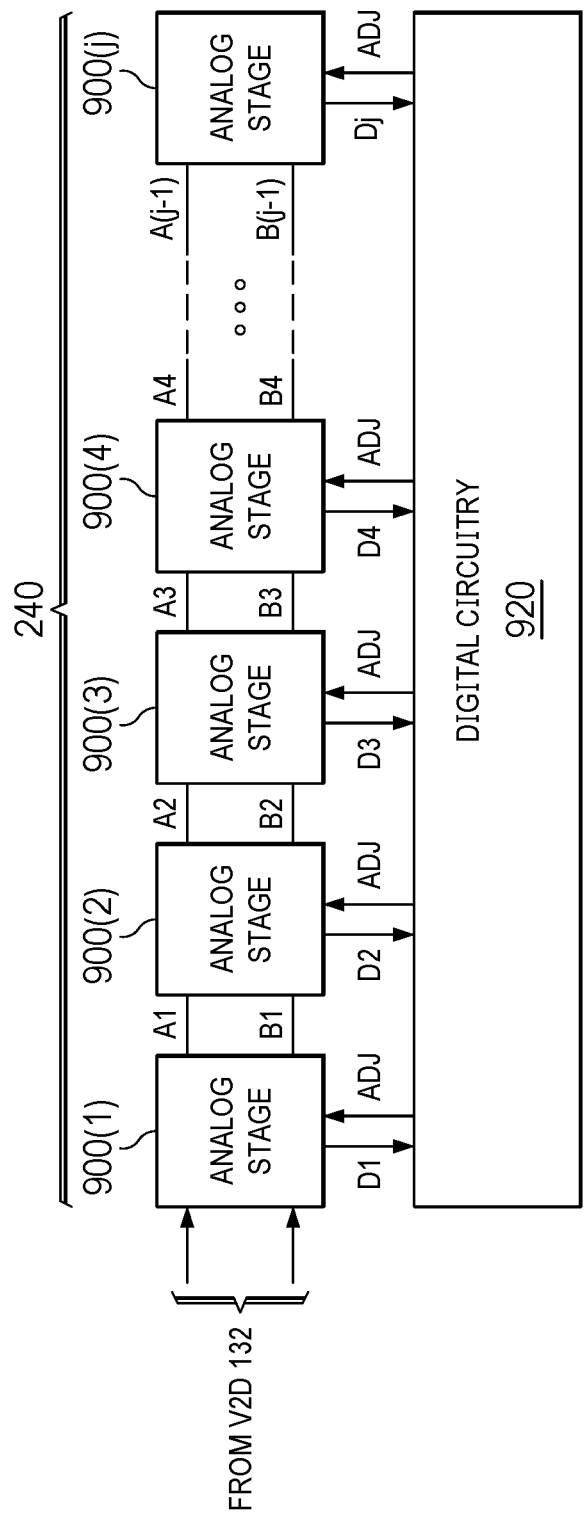
FIG. 9 is an electrical diagram, in block form, of an architecture of an HADC in an example of an ADC according to FIG. 2.

FIG. 9 illustrates an example architecture for TDC components 134 of ADC 110 in this example. More particularly, the architecture of FIG. 9 corresponds to HADC 240 in ADC 200 in this additional or alternative example. HADC 241 in the same ADC 200 is similarly constructed. In this example, HADC 240 as shown in FIG. 9 includes j analog stages 900(1), 900(2), 900(3), 900(4), . . . 900(j), collectively referred to as analog stages 900, and also includes digital circuitry 920. Analog stages 900 in HADC 240 are coupled in a sequence. First analog stage 900(1) has inputs coupled to lines A0, B0 from V2D component 132 (FIG. 1), and outputs coupled to residue signal lines A1, B1. Second analog stage 900(2) in the sequence has its inputs coupled to lines A1, B1 from first analog stage 900(1), third analog stage 900(3) has its inputs coupled to residue signal lines A2, B2 from the outputs of previous analog stage 900(2), inputs of fourth analog stage 900(4) in the sequence are coupled to residue signal lines A3, B3 at the outputs of previous analog stage 900(3), and so on. In this example, analog stages 900 operate in j successive stages (j≥1). Each analog stage 900 processes a delay residue from the previous stage to provide a respective bit of digital information on a corresponding digital signal line D1, D2, . . . , Dj to digital circuitry 920. Each analog stage 900 may also have one or more inputs receiving a calibration signal from digital circuitry 240 on one or more signal lines CAL.

For example, each analog stage 900 may include a logic gate, such as an AND function, and a delay comparator, each of which have input coupled to the residue signal lines from the previous analog stage, or to V2D component 132 in the case of analog stage 900(1). In this example, the residue signals on lines A[i-1], B[i-1] input to an analog stage 900(i) are in the form of logic level transitions, with the relative time delay between the transitions on the two lines indicative of a voltage. Each analog stage 900(i) generates signal transitions on its output lines A[i], B[i], with the relative time delay in those transitions expressing a residue value from that $i^{th}$ instance of analog stage 900(i). A digital output of analog stage 900(i) is coupled to line D[i], via which the $i^{th}$ bit is communicated from that analog stage 900(i) to digital circuitry 920. Digital circuitry 920 generates an output digital word that is applied to LUT 250 (FIG. 2).

Further detail regarding this particular TDC component architecture shown in FIG. 9 is provided by U.S. Pat. No. 10,778,243, and by U.S. application Ser. No. 18/174,187 filed Feb. 24, 2023, both commonly assigned herewith and incorporated herein by this reference.

Analog stages 900(1) through 900(j) each ideally apply an accurate transfer function on its input residue signals to produce its digital output and output residue signals. In practice, however, errors in gain, bandwidth, offset, and the like deviate the analog stage transfer functions from the ideal, causing INL as reflected in the output of ADC 200. In this example, estimates of INL obtained in the examples described above in connection with FIGS. 2 through 8 can be used in estimating corrections to be applied to analog stages 900, further reducing the overall INL of ADC 200.

Figure 10:
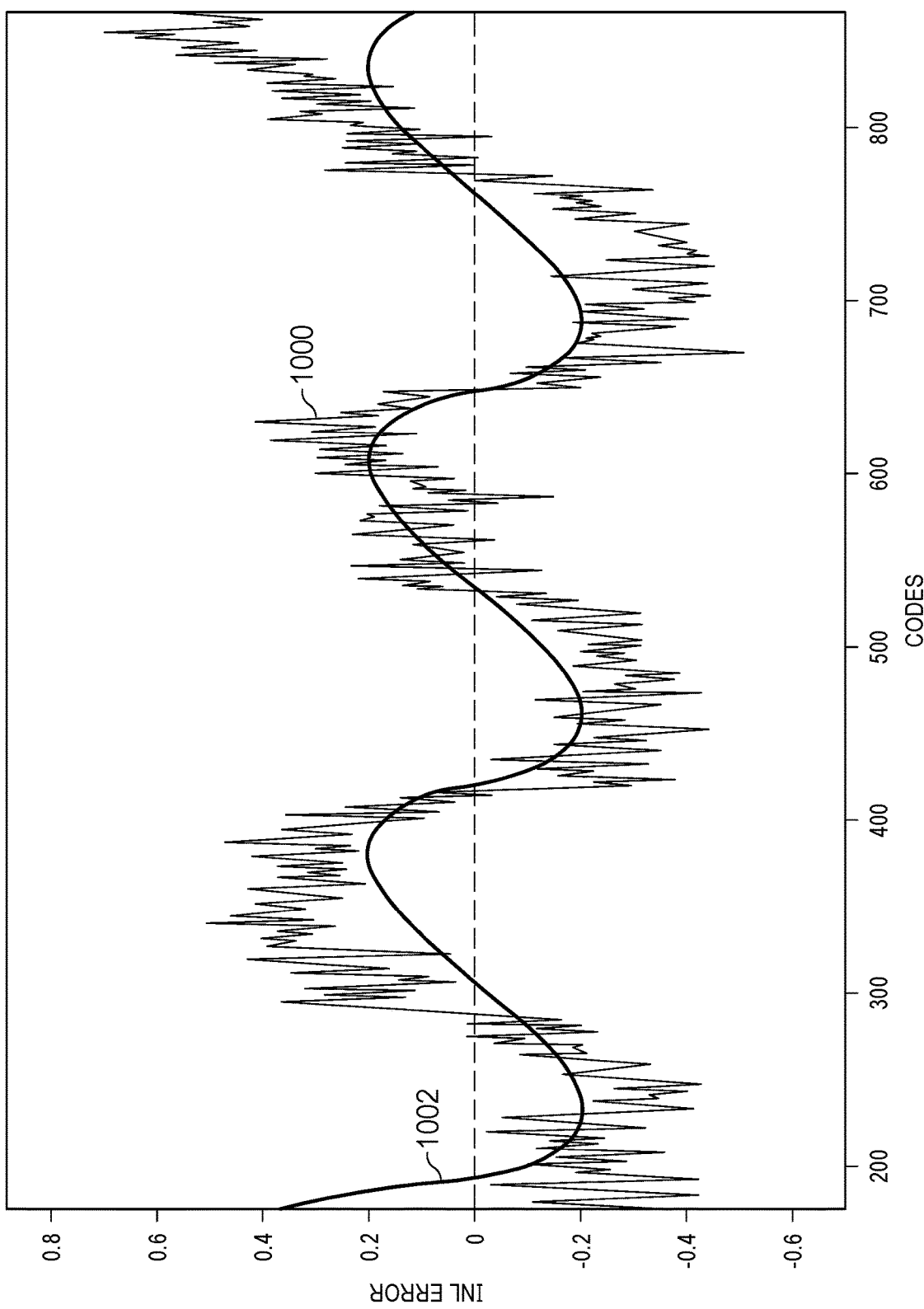
FIG. 10 illustrates plots of a known error profile and estimates of INL over a range of codes of an ADC.

In this example, an error profile corresponding to limitations of analog stages 900 in connection with one or more parameters is fit to the observed INL estimates. For example, plot 1002 of FIG. 10 shows the error profile due to bandwidth limitations for one of analog stages 900 in HADC 240 of FIG. 9. As evident from this plot 1002, bandwidth error exhibits a periodic characteristic over a range of ADC codes. Plot 1000 of FIG. 10 shows an example of estimated INL over this same range of ADC codes, obtained according to the method of FIG. 5 described above and scaled to fit plot 1002. Plot 1000 in this example exhibits a similar periodic characteristic as the known bandwidth error profile. By fitting the estimated INL to a known error profile, adjustment of the corresponding analog parameter at analog stages 900 can thus reduce the overall INL of ADC 200.

Figure 11:
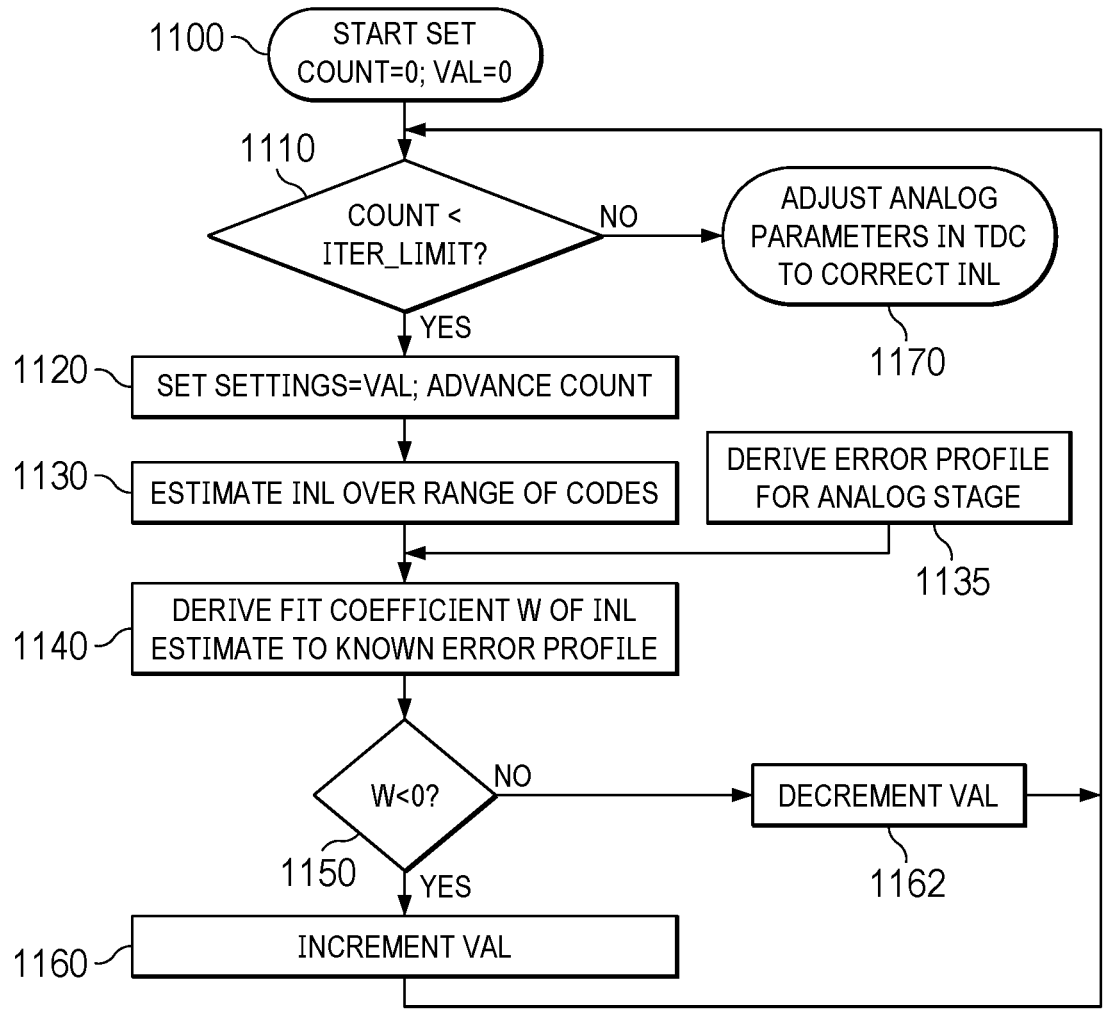
FIG. 11 is a flow diagram illustrating an example method of applying corrections to analog stages in the HADC architecture of FIG. 9.

FIG. 11 illustrates a method of correcting analog stages 900 in HADC 240 based on fitting estimates of INL to a known error profile in an example. As before, the method of FIG. 11 may be executed in ADC 200 by control logic 150, including for example INL estimation logic 255 and LUT filling logic 270. For example, the method of FIG. 11 may be executed as part of a background calibration routine applied to ADC 200 within the overall calibration scheme of FIG. 6. INL estimation logic 255 can be implemented in the form of firmware. Alternatively, INL estimation logic 255 may be implemented by way of programmable logic circuitry in combination with program memory resources storing the appropriate executable instructions for the described estimation method. In addition or in the alternative, dedicated hardware (e.g., accumulators) can be provided in or in conjunction with control logic 150.

In start process block 1100, loop parameters COUNT and VAL are each initialized to a value of 0. Decision block 110 determines whether the current value of parameter COUNT is less than iteration limit ITER_LIMIT. In this initial pass through the loop, decision 1110 returns a "yes" result. In process block 1120, one or more analog settings is set to the current value of parameter VAL, and parameter COUNT is advanced.

In process block 1130, the INL of HADC 240 is estimated over a range of codes, for instance in the example methods described above, such as in FIG. 5 or FIG. 8. For the INL estimates of HADC 240 in process block 1130, HADC 241 is used as a reference, as described above. For purposes of analog stage correction in this example, INL estimates may be obtained in process block 1130 only over a portion of the full input code range, as representative of the full range.

In process block 1140, the estimated INL obtained in process block 1130 is fit to a known error profile, as derived in process block 1135 from measurement or characterization. The fitting performed in process block 1140 produces a fit coefficient W indicating how well the INL estimates fit the known profile. The value of fit coefficient W is used to adjust the value of parameter VAL in order to obtain a better fit. In this example, decision block 1140 determines whether fit coefficient W is less than zero. If so (decision block 1140 returns a "no"), parameter VAL is incremented in process block 1160. If not (decision block 1140 returns a "yes"), parameter VAL is decremented in process block 1162.

Following either process block 1160 or process block 1162, control returns to decision block 1110 to determine whether the number of iterations performed is less than the full number of iterations. If not (decision 1110 is "yes"), the analog settings are set to the current value of parameter VAL (as incremented or decremented), and parameter COUNT is advanced. INL is again estimated over the range of codes in process block 1130, and the fit of the INL estimates to the known error profile is again evaluated in process block 1140.

Upon the full number of iterations being performed (decision block 1110 returns a "no" result), fitting of the estimated INL to the known error profile is completed. As a result of the iterative adjustment of analog settings to obtain a reasonable fit of INL estimates to the known profile, a good estimate of the analog error can be obtained at this point in the overall method of FIG. 11.

In this example, adjustment of one or more analog stages 900 to correct for this known error profile, for example by adjusting or trimming the gain, bandwidth, or offset of the involved analog stages 900, is then performed in process block 1170. Digital circuitry 920 may communicate such adjustment to the individual analog stages 900 on lines ADJ, as shown in FIG. 9. Correction of error at the analog stages of TDC component 134 constructed in the architecture of FIG. 9 requires less power consumption than corresponding correction in the digital domain.

As described above relative to FIG. 6, a similar approach can be applied to HADC 241, using HADC 240 as a reference in process block 1130.

The described examples provide a self-referenced background calibration loop for delay-domain ADCs with improved linearity by correcting systematic integral nonlinearity, such as that due to mismatch between the calibration path and the signal path of the ADC. In these examples, split ADCs (e.g., "half" ADCs) with very small mismatches relative to one another can serve as references in the calibration, allowing the INL calibration to extend across multiple Nyquist bands of the ADC. This increased bandwidth for calibration of the delay-domain ADC is a significant improvement over prior art ADCs, such as those using heterogeneous ADCs in calibration (e.g., using a linear ADC to calibrate the higher data rate delay-domain ADC).

The one or more examples described in this specification are selected to provide a particularly advantageous context. However, it is also contemplated that aspects of these examples may be beneficially applied in other applications. Accordingly, this description is provided by way of example only, and is not intended to limit the true scope of the claims.

As used herein, the terms "terminal", "node", "interconnection" and "pin" are used interchangeably. Unless specifically stated to the contrary, these terms are generally used to mean an interconnection between or a terminus of a device element, a circuit element, an integrated circuit, a device, or other electronics or semiconductor component.

Unless otherwise stated, "about," "approximately," or "substantially" preceding a value means+/−10 percent of the stated value. Modifications are possible in the described examples, and other examples are possible within the scope of the claims.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party. While, in some examples, certain elements are included in an integrated circuit and other elements are external to the integrated circuit, in other examples, additional or fewer features may be incorporated into the integrated circuit. In addition, some or all of the features illustrated as being external to the integrated circuit may be included in the integrated circuit and/or some features illustrated as being internal to the integrated circuit may be incorporated outside of the integrated. As used herein, the term "integrated circuit" means one or more circuits that are: (i) incorporated in/over a semiconductor substrate; (ii) incorporated in a single semiconductor package; (iii) incorporated into the same module; and/or (iv) incorporated in/on the same printed circuit board.

Circuits described herein are reconfigurable to include the replaced components to provide functionality at least partially similar to functionality available prior to the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

Uses of the phrase "ground" in the foregoing description include a chassis ground, an Earth ground, a floating ground, a virtual ground, a digital ground, a common ground, and/or any other form of ground connection applicable to, or suitable for, the teachings of this description.

Modifications are possible in the described examples, and other examples are possible, within the scope of the claims.

What is claimed is:

1. A method, comprising:
converting a first analog level plus a first offset to a first digital value using a first delay domain analog-to-digital converter (ADC);
converting the first analog level plus a second offset to a second digital value using a second delay domain ADC;
computing a first difference value between the first digital value and the second digital value;
converting the first analog level minus the first offset to a third digital value using the first delay domain ADC;
converting the first analog level plus the second offset to a fourth digital value using the second delay domain ADC;
computing a second difference value between the third digital value and the fourth digital value;
computing a third difference between the first and second difference values; and
storing, in a memory associated with the first delay domain ADC, an adjustment corresponding to the first analog level and based on the third difference.

2. The method of claim 1, further comprising:
converting a reference digital value to the first analog level using a digital-to-analog converter (DAC).

3. The method of claim 1, wherein converting the first analog level plus a first offset to a first digital value comprises:
adding the first offset and the first analog level; and
applying the added first offset and first analog level to an input of the first ADC;
wherein converting a first analog level plus a second offset to a second digital value comprises:
adding the second offset and the first analog level; and
applying the added second offset and first analog level to an input of the second ADC;
and wherein converting a first analog level minus the first offset to a third digital value comprises:
adding a negative of the first offset and the first analog level; and
applying the added negative of the first offset and first analog level to an input of the first ADC.

4. The method of claim 3, wherein the converting of the first analog level plus the first offset to the first digital value and the converting of the first analog level plus the second offset to the second digital value are performed at substantially the same time;
wherein converting a first analog level plus the second offset to a fourth digital value comprises:
adding the second offset and the first analog level; and
applying the added second offset and first analog level to an input of the second ADC;
and wherein the converting of the first analog level minus the first offset to the third digital value and the converting of the first analog level plus the second offset to the fourth digital value are performed at substantially the same time.

5. The method of claim 1, wherein the first delay domain ADC includes a look-up-table (LUT) memory storing correction values associated with a plurality of analog levels;
wherein storing an adjustment comprises:
applying the adjustment to a correction value stored in the LUT memory associated with the first analog level.

6. The method of claim 5, further comprising:
repeating the converting and computing operations;
applying an incremental adjustment based on the third difference obtained in the repeated computing operations to the correction value stored in the LUT memory associated with the first analog level; and
again repeating the converting and computing operations and applying the incremental adjustment until a convergence criterion is satisfied.

7. The method of claim 1, wherein converting to the first digital value and converting to the second digital value are each performed for each of a plurality of analog levels including the first analog level;
wherein the computing of the first difference value is performed over the plurality of analog levels including the first analog level;
wherein converting to the third digital value and converting to the fourth digital value are each performed for each of the plurality of analog levels including the first analog level;
wherein the computing of the second difference value is performed over the plurality of analog levels including the first analog level;
the method further comprising:
integrating the third differences for each of the plurality of analog levels including the first analog level into an integral non-linearity (INL) estimate;
and wherein the adjustment for the first delay domain ADC is based on the INL estimate and corresponds to each of the plurality of analog levels including the first analog level.

8. The method of claim 7, wherein the computing of the first difference value comprises:
accumulating differences between the first and second digital values over the plurality of analog levels including the first analog level;
and wherein the computing of the second difference value comprises:
accumulating differences between the third and fourth digital values over the plurality of analog levels including the first analog level.

9. The method of claim 7, further comprising:
detecting a rate of change of error between the first and second differences over the plurality of analog levels; and
applying a correction to the adjustment for the first delay domain ADC based on the detected rate of change of error.

10. The method of claim 1, further comprising:
converting a second analog level plus a third offset to a fifth digital value using the second delay domain ADC;
converting the second analog level with a fourth offset to a sixth digital value using the first delay domain ADC;
computing a fourth difference value between the fifth digital value and the sixth digital value;
converting the second analog level minus the third offset to a seventh digital value using the second delay domain ADC;
converting the second analog level with the fourth offset to an eighth digital value using the first delay domain ADC;
computing a fifth difference value between the seventh digital value and the eighth digital value;
computing a sixth difference between the fourth and fifth difference values; and
storing, in the memory, an adjustment for the second delay domain ADC, the adjustment corresponding to the second analog level and based on the sixth difference.

11. The method of claim 1, further comprising:
performing the converting, and computing steps over a range of analog levels to obtain third difference values corresponding to the range of analog levels;
obtaining a fit coefficient corresponding to a fit of the third difference values to a known error profile of one or more analog stages in the first delay domain ADC;
adjusting an analog setting responsive to the fit coefficient;
repeating the performing, obtaining, and adjusting over a plurality of iterations; and
adjusting analog parameters in the one or more analog stages responsive to the adjusted analog setting.

12. A circuit, comprising:
a digital-to-analog converter (DAC), having an output;
a first analog-to-digital converter (ADC) of a delay-domain type, having an input coupled to the DAC, and having an output;

a first look-up-table, having an input coupled to the output of the first ADC, and configured to store correction values for the first ADC;
a second ADC of a delay-domain type, having an input coupled to the output of the DAC, and having an output; and
logic circuitry, configured to modify contents of the first look-up table by performing a plurality of operations comprising:
controlling the first ADC to convert a first analog level from the DAC plus a first offset to a first digital value;
controlling the second ADC to convert the first analog level plus a second offset to a second digital value;
computing a first difference value between the first digital value and the second digital value;
controlling the first ADC to convert the first analog level minus the first offset to a third digital value;
controlling the second ADC to convert the first analog level plus the second offset to a fourth digital value;
computing a second difference value between the third digital value and the fourth digital value;
computing a third difference between the first and second difference values; and
based on the third difference, adjusting a correction value associated with the first analog level in the first look-up table.

13. The circuit of claim 12, further comprising:
a first input multiplexer, having an input coupled to the output of the DAC, an input coupled to receive an input signal, and an output;
a second input multiplexer, having an input coupled to the output of the DAC, an input coupled to receive an input signal, and an output;
a first adder, having an input coupled to the output of the first input multiplexer, an input coupled to receive a first offset signal, and an output coupled to the input of the first ADC; and
a second adder, having an input coupled to the output of the first input multiplexer, an input coupled to receive a second offset signal, and an output coupled to the input of the second ADC.

14. The circuit of claim 12, wherein the control circuitry is configured to control the first ADC to convert the first analog level plus the first offset to the first digital value and controls the second ADC to convert the first analog level plus the second offset to the second digital value at substantially the same time;
and wherein the control circuitry is configured to control the first ADC to convert the first analog level minus the first offset to the third digital value and controls the second ADC to convert the first analog level plus the second offset to the fourth digital value at substantially the same time.

15. The circuit of claim 12, wherein the control circuitry is configured to:
control the first and second ADCs to convert to the first and second digital values, respectively, for each of a plurality of analog levels including the first analog level;
compute the first difference value over the plurality of analog levels including the first analog level;
control the first and second ADCs to convert to the third and fourth digital values, respectively, for each of the plurality of analog levels including the first analog level;
compute the second difference value over the plurality of analog levels including the first analog level;
compute the third difference value over the plurality of analog levels including the first analog level;
integrate the third differences for each of the plurality of analog levels including the first analog level into an integral non-linearity (INL) estimate;
adjust correction values for each of the plurality of analog levels including the first analog level based on the INL estimate.

16. The circuit of claim 15, wherein the control circuitry is configured to compute the first difference value by:
accumulating differences between the first and second digital values over the plurality of analog levels including the first analog level;
and wherein the control circuitry is configured to compute the second difference value by:
accumulating differences between the third and fourth digital values over the plurality of analog levels including the first analog level.

17. The circuit of claim 15, wherein the control circuitry is further configured to:
detect a rate of change of error between the first and second differences over the plurality of analog levels; and
further adjust the correction values for each of the plurality of analog levels including the first analog level based on the detected rate of change of error.

18. An analog-to-digital converter, comprising:
a first half analog-to-digital converter (HADC) of a delay domain type;
a first look-up-table (LUT) memory associated with the first HADC, and configured to store correction values associated with a plurality of analog levels;
a second HADC of the delay domain type;
control logic configured to adjust correction values associated with the plurality of analog levels in the first LUT memory by a plurality of operations comprising, for each of the plurality of analog levels:
controlling the first HADC to convert the analog level plus a first offset to a first digital value;
controlling the second HADC to convert the analog level plus a second offset to a second digital value;
computing a first difference value between the first digital value and the second digital value;
controlling the first HADC to convert the analog level minus the first offset to a third digital value;
controlling the second HADC to convert the analog level plus the second offset to a fourth digital value;
computing a second difference value between the third digital value and the fourth digital value;
computing a third difference between the first and second difference values; and
based on the third difference, adjusting a correction value associated with the analog level in the first LUT memory.

19. The analog-to-digital converter of claim 18, further comprising:
a second LUT memory associated with the second HADC, and configured to store correction values associated with the plurality of analog levels;
and wherein the control logic is further configured to adjust correction values associated with the plurality of analog levels in the second LUT memory by a plurality of operations comprising, for each of the plurality of analog levels:

controlling the second HADC to convert the analog level plus a third offset to a fifth digital value;

controlling the first HADC to convert the analog level with a fourth offset to a sixth digital value;

computing a fourth difference value between the fifth digital value and the sixth digital value;

controlling the first ADC to convert the analog level minus the third offset to a seventh digital value;

controlling the second ADC to convert the analog level with the fourth offset to an eighth digital value;

computing a fifth difference value between the seventh digital value and the eighth digital value;

computing a sixth difference between the fourth and fifth difference values; and based on the sixth difference, adjusting a correction value associated with the analog level in the second LUT memory.

20. The analog-to-digital converter of claim 18, wherein the control logic is configured to control the first HADC to convert the analog level plus the first offset to the first digital value and controls the second HADC to convert the analog level plus the second offset to the second digital value at substantially the same time;

and wherein the control logic is configured to control the first HADC to convert the analog level minus the first offset to the third digital value and controls the second HADC to convert the analog level plus the second offset to the fourth digital value at substantially the same time.

21. The analog-to-digital converter of claim 18, wherein the control logic is further configured to:

detect a rate of change of error between the first and second differences over a plurality of analog input values; and further adjust the correction value based on the detected rate of change of error.

22. The analog-to-digital converter of claim 18, wherein the first HADC comprises:

a plurality of analog stages coupled in a sequence;

digital circuitry having inputs coupled to digital outputs of the plurality of analog stages, and having one or more adjustment outputs coupled to at least one of the plurality of analog stages;

wherein the control logic is further configured to:

performing the controlling and computing steps over a range of analog levels to obtain third difference values corresponding to the range of analog levels;

obtaining a fit coefficient corresponding to a fit of the third difference values to a known error profile of one or more of the analog stages;

adjusting an analog setting responsive to the fit coefficient;

repeating the performing, obtaining, and adjusting over a plurality of iterations; and operating the digital circuitry to adjust analog parameters in the one or more analog stages responsive to the adjusted analog setting.

\* \* \* \* \*